(12) United States Patent
Toong et al.

(10) Patent No.: US 7,989,942 B2
(45) Date of Patent: Aug. 2, 2011

(54) IC PACKAGE WITH CAPACITORS DISPOSED ON AN INTERPOSAL LAYER

(75) Inventors: Teik Tiong Toong, Penang (MY); Loon Kwang Tan, Penang (MY)

(73) Assignee: Altera Corporation, San Jose, CA (US)

(*) Notice: Subject to any disclaimer, the term of this patent is extended or adjusted under 35 U.S.C. 154(b) by 161 days.

(21) Appl. No.: 12/356,491

(22) Filed: Jan. 20, 2009

(65) Prior Publication Data

US 2010/0181644 A1    Jul. 22, 2010

(51) Int. Cl.
*H01L 23/02* (2006.01)
(52) U.S. Cl. .................. 257/686; 257/E23.085
(58) Field of Classification Search .......... 257/686, 257/706, 724, 778, 776, 777, E23.085; 438/109
See application file for complete search history.

(56) References Cited

U.S. PATENT DOCUMENTS

| 6,005,778 | A  | * | 12/1999 | Spielberger et al. ......... 361/770 |
| 7,705,450 | B2 | * | 4/2010  | Vinson et al. ................ 257/724 |

| 2006/0220206 | A1 | 10/2006 | Gerber et al. |
| 2007/0085190 | A1 | 4/2007  | Vinson et al. |
| 2007/0205505 | A1 | 9/2007  | Watanabe et al. |

FOREIGN PATENT DOCUMENTS

KR    1020080084279    9/2008

OTHER PUBLICATIONS

PCT International Search Report, Aug. 19, 2010, 3 pgs.

* cited by examiner

*Primary Examiner* — Quoc D Hoang
(74) *Attorney, Agent, or Firm* — Martine Penilla & Gencarella, LLP (57) ABSTRACT

An integrated circuit (IC) package with a plurality of chip capacitors placed on a surface of a die is disclosed. The chip capacitors may be placed on top of the die with an interposal substrate layer. Placing chip capacitors on top of the die may reduce the size of the packaging substrate required. One or more wires may be used to connect the chip capacitors on the interposal layer to the packaging substrate. The IC package may include a lid and a thermal interface material (TIM) placed on top of the die. The lid may be shaped such that a protruding portion of the lid contacts the die directly through the TIM to improve heat dissipation.

19 Claims, 7 Drawing Sheets

(12) United States Patent
US 7,989,942 B2

IC PACKAGE WITH CAPACITORS DISPOSED ON AN INTERPOSAL LAYER

BACKGROUND

The present invention relates generally to integrated circuits (ICs) and more specifically to IC packages with on-package decoupling (OPD) capacitors.

Decoupling capacitors or chip capacitors are typically used to remove unwanted signals or reduce power supply noise to the chip. During normal operations of the IC, power usage of the chip may vary. For example, the chip may try to draw additional current from the power supply when there is a change in the state of the circuit. The constant change in the current consumption of the IC causes current fluctuation and creates unwanted noise in the chip. As such, decoupling capacitors are usually included in a typical IC package to stabilize the current fluctuation in order to make the device run more smoothly.

These capacitors are usually placed on the substrate layer of the IC package. However, they cannot be placed too close to the die and there must be ample space between the die and the chip capacitors surrounding the die. Hence, when a bigger die is used, a bigger substrate is needed to accommodate the chip capacitors. In other words, a bigger die would require an even bigger packaging substrate in order to fit the die and all the chip capacitors in the IC package. The increase in package size not only increases packaging cost but also manufacturing risks due to the larger packaging substrate used.

Thus, it is highly desirable to have an IC package that can accommodate all the chip capacitors that need to be placed in the IC package without further expanding the size of the packaging substrate.

SUMMARY

Embodiments of the present invention include apparatuses and a method for creating an IC package with OPD capacitors.

It should be appreciated that the present invention can be implemented in numerous ways, such as a process, an apparatus, a system, or a device. Several inventive embodiments of the present invention are described below.

In one embodiment, an IC package is disclosed. The IC package comprises an IC disposed on a build-up substrate. A substrate layer is disposed onto a top surface of the IC. In some embodiments, the substrate layer disposed onto the IC is thinner compared to the build-up substrate. A plurality of capacitors is disposed on the substrate layer on the top surface of the IC. One or more wires are used to connect the capacitors on the substrate layer to the build-up substrate beneath the IC. In some embodiments, the wires are copper (Cu) wires. In other embodiments, the wires are gold (Au) wires.

In another embodiment, an IC package with a tape circuit is disclosed. The IC package comprises an IC disposed on a surface of a build-up substrate. A tape circuit is disposed on a top surface of the IC. In one embodiment, the tape circuit extends over the edge of the IC and is connected to the build-up substrate. A plurality of capacitors is disposed on the tape circuit.

In yet another embodiment in accordance with the present invention, a method of packaging an IC is disclosed. The method includes placing an IC onto a packaging substrate. A plurality of chip capacitors is placed on a substrate layer. The substrate layer is then placed onto a top surface of the IC. In one embodiment, the substrate layer is an interposer placed between the IC and the plurality of chip capacitors. The plurality of chip capacitors on the substrate layer is connected to the packaging substrate with one or more wires.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe apparatuses and a method for creating an IC package with OPD capacitors.

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create an IC package with OPD capacitors without expanding the size of the packaging substrate to accommodate the placement of the capacitors. The embodiments allow a smaller packaging substrate to be used by placing chip capacitors on an interposal layer on top of the die instead of placing the capacitors on the build-up substrate, i.e. the packaging substrate, surrounding the die. The interposal layer is an intermediary substrate layer placed in between the die and the chip capacitors. Hence, the interposal layer can be a substrate layer, albeit a thinner layer compared to the typical packaging substrate, sandwiched between the die at the bottom and the chip capacitors placed on top. This way, required chip capacitors can still be place in the IC package without increasing the size of the packaging substrate, i.e., the build-up substrate, and the overall IC package. The size of the package used is then based on the size of the die used and not the number of chip capacitors placed in the package.

Figure 1:
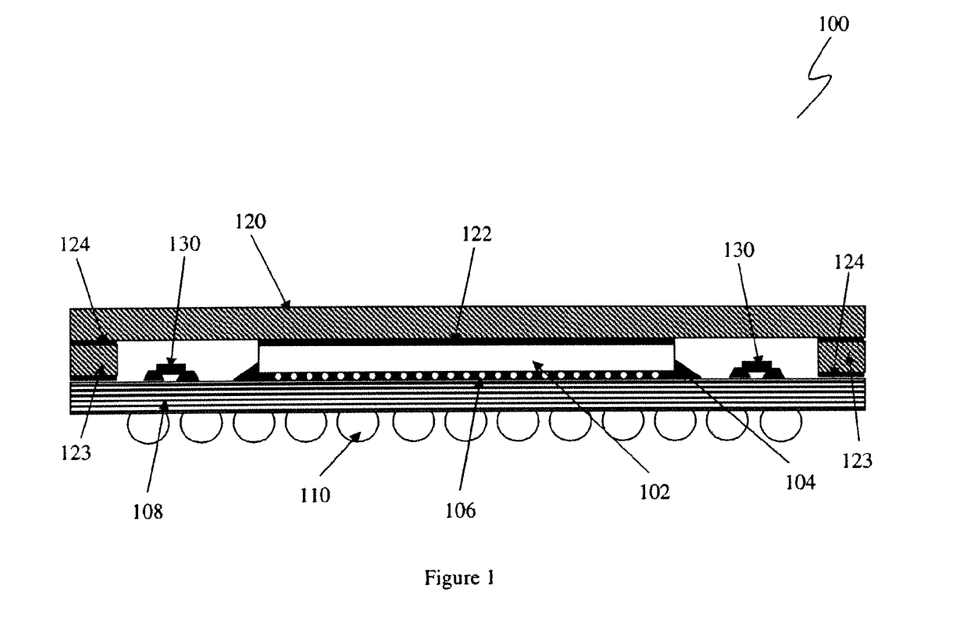
FIG. 1, meant to be exemplary and not limiting, shows an integrated circuit package 100 with chip capacitors.

FIG. 1, meant to be exemplary and not limiting, shows an integrated circuit package 100 with chip capacitors 130. IC 102 with solder bumps 106 is disposed on one side or an outer periphery of build-up substrate 108. IC 102 has a plurality of contact pads 106 that connects IC 102 to build-up substrate 108. The cavity between IC 102 and build-up substrate 108 is filled with underfill 104. A plurality of contact leads 110 is disposed on an opposing side of build-up substrate 108. Signals from IC 102 are transmitted outside of IC package 100 by contact leads or solder balls 110 that are attached to contact pads 106. A plurality of capacitors 130, generally used to reduce noise generated by IC 102, is placed on build-up substrate 108, around IC 102. Thermal interface material (TIM) 122 is disposed over IC 102 and lid 120 is placed on top of TIM 122. Lid 120 is normally made of highly conductive material in order to effectively transfer heat from IC 102 out of IC package 100. TIM 122 is used to fill the gap between IC 102 and lid 120 to increase thermal transfer efficiency. Sides of lid 120 are supported by support member 123. In an exemplary embodiment, support member 123 is a metal stiffener. Adhesive 124 is used to connect support member 124 to lid 120 and build-up substrate 108.

Figure 2:
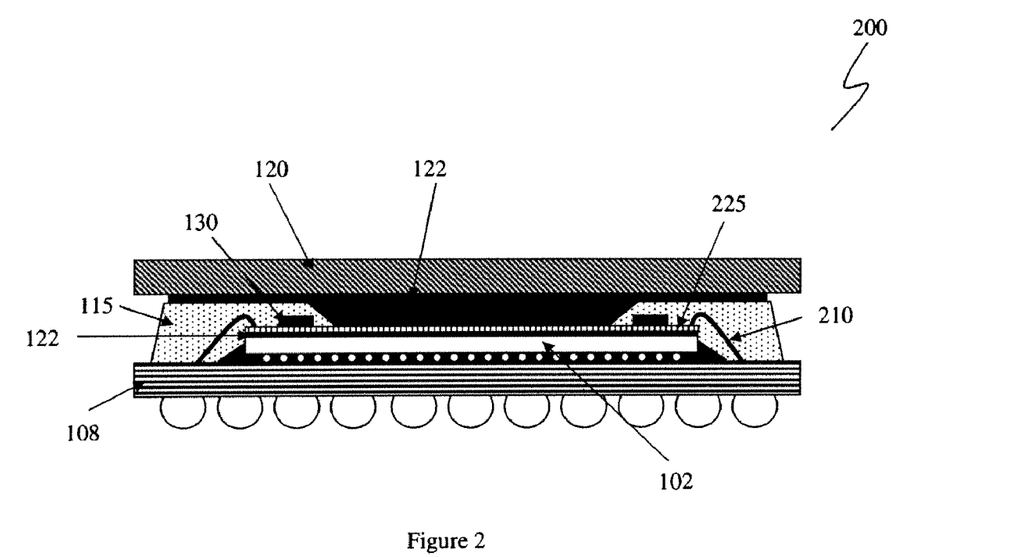
FIG. 2, meant to be exemplary and not limiting, shows an IC package 200 as an embodiment in accordance with the present invention.

FIG. 2, meant to be exemplary and not limiting, shows an IC package 200 as an embodiment in accordance with the present invention. Substrate layer 225 is placed on top of TIM 122 on the top surface of IC 102. In one embodiment, substrate layer 225 includes two metal layers and is thinner than build-up substrate 108. A plurality of chip capacitors 130 is placed on top of substrate layer 225. In an exemplary embodiment, substrate layer 225 is an interposal layer placed between IC 102 and the plurality of chip capacitors 130. Substrate layer 225 is attached to IC 102 through a layer of TIM 122. The plurality of capacitors 130 on top of IC 102 is connected to build-up substrate 108 with wires 210. It should be appreciated that substrate layer 225 is a multi-layered substrate, where the layers may be ground or power planes separated by insulating layers, that electrically connects chip capacitors 130 to build-up substrate 108 via wires 210. In one embodiment, wires 210 are copper (Cu) wires. In another embodiment, wires 210 are gold (Au) wires. In yet another embodiment, wires 210 are made of aluminum (Al) or other conductive metals that can be bonded and electrically coupled to build-up substrate 108. In one embodiment, wires 210 are placed as close as possible to the edge of substrate layer 225 and the edge of die 102 to shorten the length of wires 210 in order to reduce inductance. TIM 122 is placed over substrate layer 225. TIM 122 is shaped such that the center portion of TIM 122 is thicker than the sides of TIM 122. The thicker center portion of TIM 122 contacts substrate layer 225. The area surrounding IC 102 and capacitors 130 in IC package 200 is filled with molding compound 115. Therefore, in some embodiments the sides of TIM 122 are supported by molding compound 115. In other embodiments, TIM 122 is located only in the center portion of TIM 122 without having the extended sides. In some of these embodiments, adhesive is used to attach lid 120 to molding compound 115. Lid 120 is placed on top of TIM 122 over IC package 200. In one embodiment, lid 120 is a heat sink made of highly conductive metal such as copper.

Figure 2A:
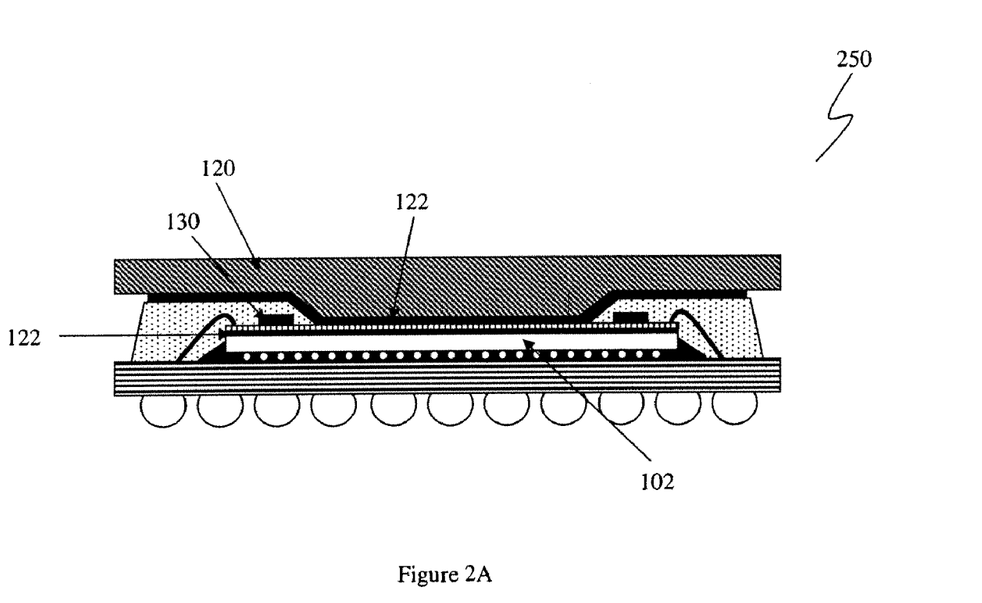
FIG. 2A, meant to be illustrative and not restrictive, shows an IC package 250 with a lid 120 shaped to improve heat dissipation as an embodiment in accordance with the present invention.

FIG. 2A, meant to be illustrative and not restrictive, shows an IC package 250 with a lid 120 shaped to improve heat dissipation as an embodiment of the present invention. A plurality of capacitors 130 is placed on substrate layer 225 which is attached to the top surface of IC 102 through a layer of TIM 122. Another layer of TIM 122 is placed on top of substrate layer 225. Lid 120, placed on top of TIM 122, is shaped in such a way that eliminates the need for TIM 122 to have a thicker center portion. Instead, lid 120 has a protruding center portion that is thicker than the sides of lid 120. In one embodiment, the protruding center portion may be referred to as an inter-portion and the sides of lid 120 may be referred to as an outer-portion. In another embodiment, heat dissipation of IC package 250 is more efficient when using a thinner layer of TIM 122 on top of IC 102.

Figure 3:
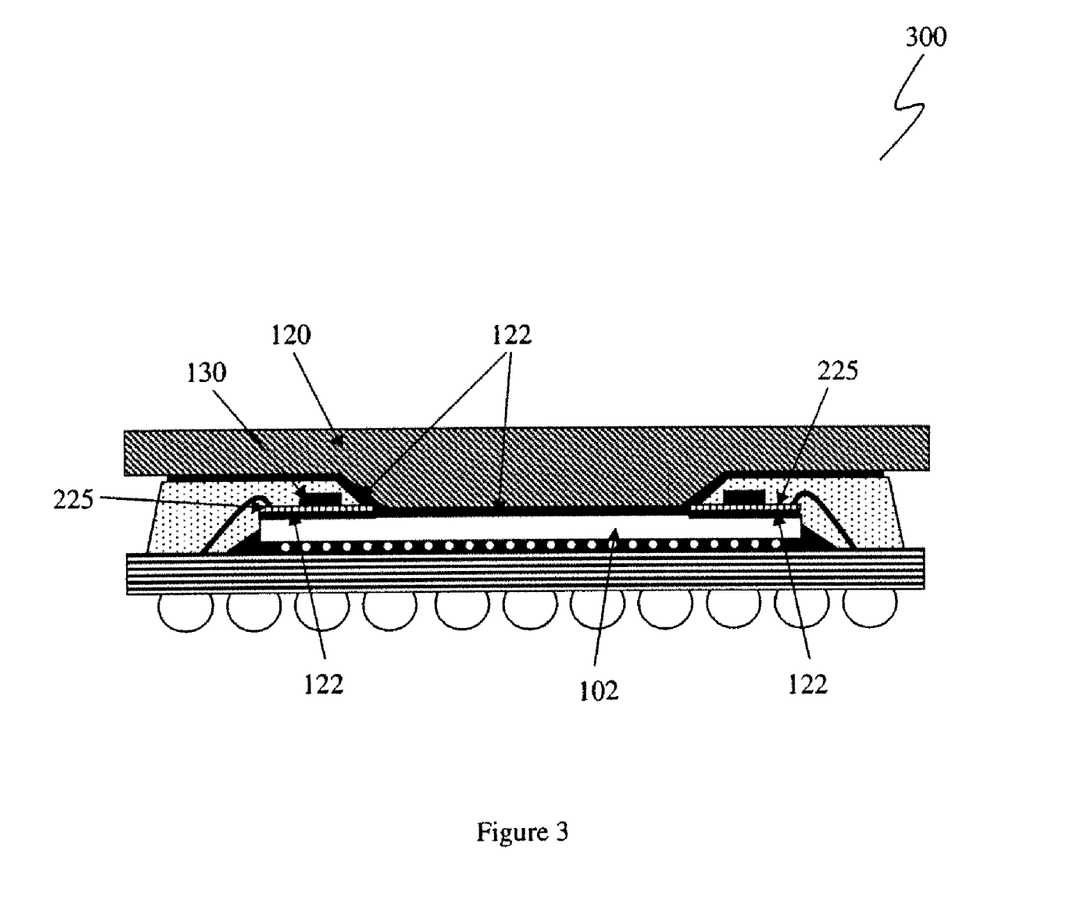
FIG. 3, meant to be illustrative and not restrictive, is a cross-sectional view of an IC package 300 in accordance with one embodiment of the present invention.

FIG. 3, meant to be illustrative and not restrictive, is a cross-sectional view of an IC package 300 in accordance with one embodiment of the present invention. An interposer, i.e., substrate layer 225 is attached to the top surface of IC 102 through TIM 122. However, unlike IC packages 200 and 250 shown in FIGS. 2 and 2A, respectively, substrate layer 225 in IC package 300 does not cover the entire area of the top surface of IC 102. Substrate layer 225 in IC package 300, as illustrated in FIG. 3, covers only the perimeter portion of the top surface of IC 102. A plurality of capacitors 130 is disposed on top of substrate layer 225 around the perimeter of the top surface of IC 102. TIM 122 is placed over IC 102 and the protruding center portion of TIM 122 is in direct contact with the center of the top surface of IC 102. Lid, i.e. heat sink, 120 is placed over IC package 300. The protruding portion of the lid, i.e. heat sink, 120 is connected to IC 102 through TIM 122. In one embodiment, the direct contact between heat sink 120 and IC 102 improves heat dissipation of IC package 300 because heat from IC 102 can travel directly to heat sink 120 through TIM 122 without going through an interposal layer, i.e., substrate layer 225.

Figure 4:
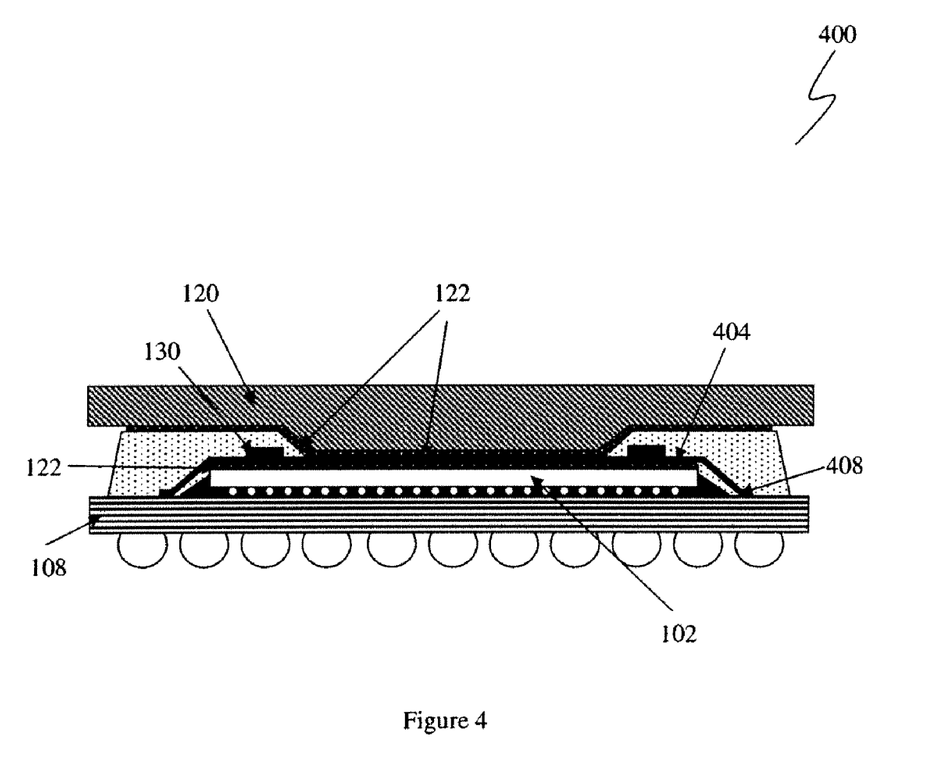
FIG. 4, meant to be illustrative and not limiting, shows an IC package 400 with a tape circuit 404 as an embodiment in accordance with the present invention.

FIG. 4, meant to be illustrative and not limiting, shows an IC package 400 with tape circuit 404 as an embodiment in accordance with the present invention. Tape circuit 404 is disposed on IC 102 as an interposal layer between the plurality of chip capacitors 130 and IC 102. A layer of TIM 122 attaches tape circuit 404 to the top surface of IC 102. In one embodiment, tape circuit 404 is a 2-metal layer flexible substrate with one layer connected to power and another layer connected to ground. Chip capacitors 130 are connected to build-up substrate 108 by tape circuit 404 which extends over IC 102 to connect to build-up substrate 108. In an exemplary embodiment, tape circuit 404 is connected to build-up substrate 108 through solder joint 408. It should be appreciated that tape circuit 404 includes a wiring pattern that delivers electric signals from chip capacitors 130 to build-up substrate 108. It should also be appreciated that tape circuit 404 may include a protective film that covers the wiring pattern on tape circuit 404 to protect the wiring pattern from external contaminants. In one embodiment, tape circuit 404 replaces substrate layer 225 in IC packages 200, 250 and 300 shown in FIGS. 2, 2A and 3 respectively. In another embodiment, using tape circuit 404 in place of wires 210 as provided in FIGS. 2-3 lowers inductance in the IC package 400. TIM 122 is placed on top of tape circuit 404 with lid 120 placed over IC package 400. Tape circuit 404 may be referred to as a unitary layer of a flexible circuit that extends over the IC.

Figure 5:
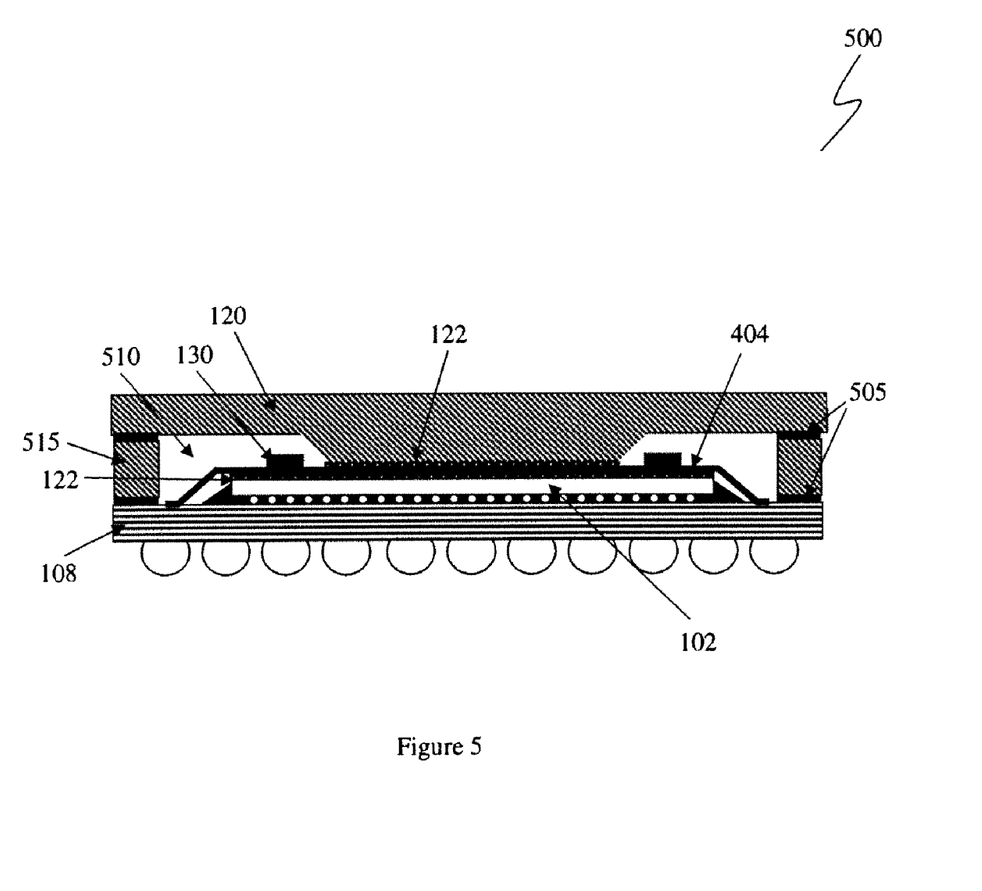
FIG. 5, meant to be illustrative and not limiting, shows an IC package 500 with a 2-piece lid as yet another embodiment of the present invention.

FIG. 5, meant to be illustrative and not limiting, shows an IC package 500 with a 2-piece lid as yet another embodiment of the present invention. Lid 120 supported by support member 515 is placed over IC package 500. The 2-piece lid used in IC package 500 is thus formed by lid 120 attached to support member 515. Lid 120 has a center protrusion that contacts TIM 122 on top of tape circuit 404 and IC 102. The center protrusion of lid 120 is in direct contact with IC 102 through TIM 122 and tape circuit 404. Even though tape circuit 404 is used in IC package 500, one skilled in the art should appreciate that substrate layer 225 as illustrated in FIGS. 2, 2A and 3 can be used as an interposal layer in place of tape circuit 404. A plurality of chip capacitors 130 is placed on tape circuit 404 in IC package 500. Molding compound 115 in IC packages 100, 200, 250, 300 and 400 is removed, leaving a void 510 surrounding IC 102 in IC package 500. In one embodiment, void 510 may be referred to as a cavity. In another embodiment, IC package 500 is not injected with molding compound 115. As such, the sides of lid 120 are supported by support member 515 instead of molding compound 115. In an exemplary embodiment, support member 515 is a stiffener made of Cu and is joined to build-up substrate 108 and lid 120 with adhesive 505. In one embodiment, adhesive 505 is a heat cure adhesive. In an exemplary embodiment, adhesive 505 is an epoxy adhesive.

Figure 6:
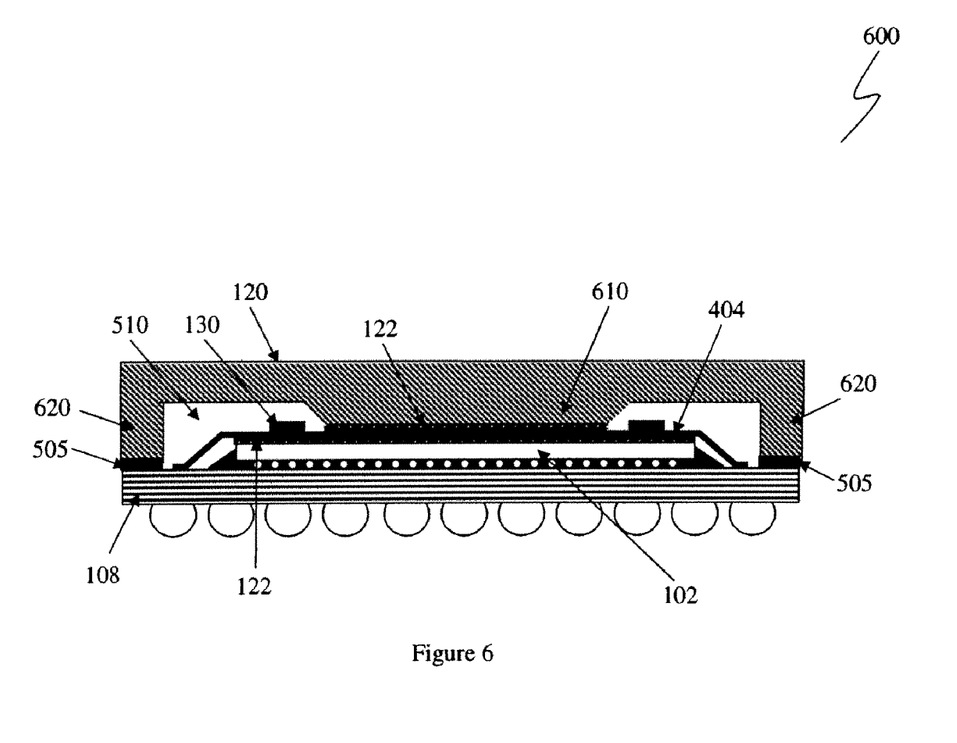
FIG. 6, meant to be illustrative and not limiting, shows an IC package 600 with a single piece lid 120 as one embodiment in accordance with the invention.

FIG. 6, meant to be illustrative and not limiting, shows an IC package 600 with a single-piece lid 120 as one embodiment in accordance with the invention. Lid 120 shown in FIG. 6 has a plurality of protrusions. First protrusion 610 extends from the center of lid 120 and touches TIM 122 placed on top of IC 102. Second protrusion 620 extends from the perimeter of lid 120 and is joined to build-up substrate 108 with adhesive 505. In one embodiment, second protrusion 620 acts as a support member that supports lid 120 placed over IC package 600. IC package 600 is not filled with a molding compound and thus a void 510 is formed around IC 102 and capacitors 130 in IC package 600. Even though capacitors 130 in IC package 600 are placed on tape circuit 404, this is meant to be illustrative and not restrictive. One skilled in the art should appreciate that tape circuit 404 can be replaced with any other appropriate interposer, e.g. substrate layer 225 used in IC packages 200, 250 and 300.

Figure 7:
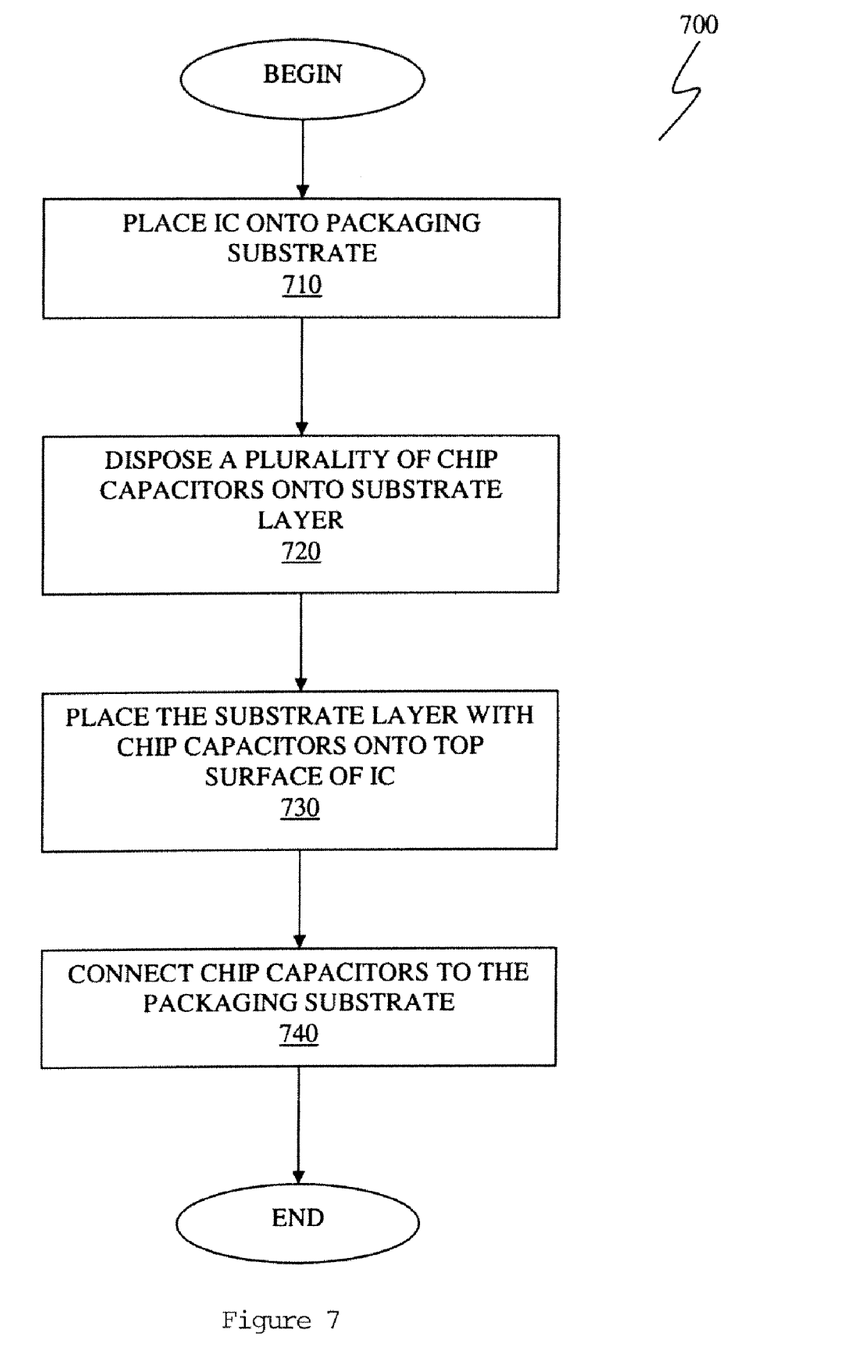
FIG. 7 shows the flow 700 for packaging an integrated circuit in order to fit chip capacitors into an IC package without increasing the size of the IC package in accordance with one embodiment of the invention.

FIG. 7 shows the flow 700 for packaging an integrated circuit in order to fit chip capacitors into an IC package without increasing the size of the IC package in accordance with one embodiment of the invention. An IC is placed on a packaging substrate in operation 710. A plurality of chip capacitors is disposed onto a surface of a substrate layer in operation 720. The substrate layer is then placed onto a top surface of the IC in operation 720. In an exemplary embodiment, the packaging substrate beneath the IC comprises 6-8 metal layers and is substantially thicker than the substrate layer placed on top of the IC. In some embodiments, the substrate layer placed on top of the IC is similar to substrate layer 225 as illustrated in FIGS. 2, 2A, and 3. In other embodiments, the substrate layer is similar to tape circuit 404 as shown in FIGS. 4, 5 and 6. The plurality of chip capacitors on top of the substrate layer is connected to the packaging substrate in operation 740. In some embodiments, wires are used to connect the chip capacitors on top of the IC to the packaging substrate. In other embodiments, a flexible substrate that bends over the edge of the IC is used to connect the chip capacitors to the packaging substrate. One skilled in the art should know that other well-known steps, such as substrate preparation, wire bonding, molding and curing, etc., in the IC packaging process have been left out so as not to obscure the present invention.

One skilled in the art will appreciate that a flip chip package with a ball grid array is provided in the exemplary illustrations of FIGS. 1-6. However, this is not meant to be limiting as the techniques described herein may be applied to other packaging configurations, e.g., heat spreader ball grid array (HS-BGA), low profile ball grid array (LBGA), thin fine pitch ball grid array (TFBGA), flip chip chip-scale package (FCCSP), etc.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC) package, comprising:
   a build-up substrate;
   an integrated circuit disposed on the build-up substrate;
   a substrate layer disposed over a top surface of the integrated circuit, wherein the substrate layer covers a perimeter portion of the top surface of the IC; and
   a plurality of capacitors disposed on the substrate layer, wherein the plurality of capacitors is coupled to the build-up substrate.

2. The IC package of claim 1, further comprising:
   a mold compound surrounding the IC, the substrate layer, and the plurality of capacitors;
   a thermal interface material (TIM) layer disposed onto a portion of a top surface of the substrate layer, wherein the top surface of the substrate layer is unexposed to the mold compound; and
   a lid having a thicker inter-portion, wherein the thicker inter-portion is disposed over the TIM layer, wherein an outer-portion of the lid is supported by the mold compound.

3. The IC package of claim 1, wherein the substrate layer covers an entire area of the top surface of the IC.

4. The IC package of claim 1, wherein the substrate layer has a uniform thickness.

5. The IC package of claim 1, wherein the build-up substrate is thicker than the substrate layer.

6. The IC package of claim 1, wherein the substrate layer includes a tape circuit.

7. An integrated circuit (IC) package, comprising:
   a build-up substrate;
   an integrated circuit disposed on a surface of the build-up substrate; and
   a tape circuit disposed on a top surface of the IC, the tape circuit having a plurality of capacitors disposed thereon, and wherein the tape circuit extends over a peripheral edge of the IC.

8. The IC package of claim 7, wherein the tape circuit is in electrical communication with the build-up substrate.

9. The IC package of claim 7, further comprising:
   a thermal interface material (TIM) disposed against a center area of the tape circuit, the TIM surrounded by the plurality of capacitors disposed on the tape circuit; and a lid having a protruding inter-portion, wherein the lid is disposed over the TIM.

10. The IC package of claim 9, wherein a cavity is defined between the tape circuit and the lid.

11. The IC package of claim 9, further comprising:
a mold compound surrounding the center area, wherein the mold compound supports the lid.

12. The IC package of claim 9, further comprising:
a support member affixed to the surface of the build-up substrate, the support member surrounding a perimeter surface of the build-up substrate, wherein the support member supports the lid.

13. The IC package of claim 7, further comprising:
a TIM disposed against a center area of the tape circuit; and
a lid having a plurality of protrusions, wherein a first protrusion extends from a center portion of the lid, a second protrusion extends from a perimeter portion of the lid, wherein the first protrusion is adjacent to the TIM, and wherein the second protrusion is adjacent to the build-up substrate.

14. An integrated circuit (IC) package, comprising:
a build-up substrate;
an integrated circuit disposed on a top surface of the build-up substrate;
a substrate layer disposed over a top surface of the integrated circuit, wherein the substrate layer covers an entire area of the top surface of the IC;
a plurality of capacitors disposed on the substrate layer, wherein the plurality of capacitors is coupled to the build-up substrate; and
a mold compound surrounding the IC, the substrate layer, and the plurality of capacitors.

15. The package of claim 14, further comprising:
a thermal interface material (TIM) layer disposed onto a portion of a top surface of the substrate layer, the top surface of the substrate layer unexposed to the mold compound; and
a lid having a thicker inter-portion, wherein the thicker inter-portion is disposed over the TIM layer, wherein an outer-portion of the lid is supported by the mold compound.

16. The package of claim 14, wherein the substrate layer includes a tape circuit.

17. The package of claim 16, wherein the tape circuit extends over a peripheral edge of the IC, and wherein the tape circuit is in electrical communication with the build-up substrate.

18. The package of claim 16, further comprising:
a thermal interface material (TIM) disposed against a center area of the tape circuit, the TIM surrounded by the plurality of capacitors disposed on the tape circuit; and
a lid having a protruding inter-portion, wherein the lid is disposed over the TIM.

19. The package of claim 14 wherein the substrate layer has a uniform thickness.

* * * * *